United States Patent
Tanaka

(10) Patent No.: US 9,153,541 B2
(45) Date of Patent: Oct. 6, 2015

(54) SEMICONDUCTOR DEVICE HAVING A SEMICONDUCTOR CHIP MOUNTED ON AN INSULATOR FILM AND COUPLED WITH A WIRING LAYER, AND METHOD FOR MANUFACTURING THE SAME

(75) Inventor: Junji Tanaka, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 289 days.

(21) Appl. No.: 12/032,444

(22) Filed: Feb. 15, 2008

(65) Prior Publication Data
US 2009/0051051 A1    Feb. 26, 2009

(30) Foreign Application Priority Data

Feb. 15, 2007 (JP) .................................. 2007034742

(51) Int. Cl.
*H01L 23/02* (2006.01)
*H01L 23/495* (2006.01)
(Continued)

(52) U.S. Cl.
CPC ............ *H01L 23/5389* (2013.01); *H01L 25/03* (2013.01); *H01L 25/0657* (2013.01); *H01L 25/105* (2013.01); *H05K 1/187* (2013.01); *H01L 24/48* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/1035* (2013.01); *H01L 2225/1058* (2013.01); *H01L 2924/01078* (2013.01); *H01L 2924/15311* (2013.01); *H05K 1/113* (2013.01); *H05K 3/20* (2013.01);

(Continued)

(58) Field of Classification Search
CPC ........... H01L 2224/48091; H01L 2224/48227; H01L 2224/73253; H01L 2224/73265; H01L 2924/00014; H01L 2924/15311; H01L 2225/0651; H01L 2225/1035; H01L 2225/1058; H01L 23/5389; H01L 23/08; H01L 23/12; H01L 23/28; H01L 23/4825; H01L 23/481; H01L 23/485; H01L 23/488; H01L 23/49; H01L 23/49506; H01L 23/498; H01L 23/49811; H01L 24/48; H01L 24/02; H01L 24/10; H01L 25/03; H01L 25/0657; H01L 25/105; H01L 21/4846; H01L 21/58; H01L 21/67144; H01L 21/786; H01L 21/84; H01L 21/76877; H01L 21/02065; H01L 21/02074; H01L 21/31051; H01L 21/76819; H01L 2224/0384; H01L 2224/06138; H01L 2224/06148; H01L 2224/06158; H01L 2224/06168; H01L 2224/06188; H01L 2224/2784; H05K 1/113; H05K 1/187; H05K 2201/09509; H05K 2201/09527; H05K 2203/049; H05K 3/20
USPC ......... 257/668, 686, 784, 777, 692, 773, 774, 257/778, 780, 678, 787, E25.006, E25.013, 257/E25.021, E25.027, E23.02, E23.124, 257/E23.116, 690, 723, 724, 725, 775, 776, 257/701, 782, 783, 786; 361/760, 772, 774
See application file for complete search history.

(56) References Cited

U.S. PATENT DOCUMENTS 3,500,144 A * 3/1970 Wetterau, Jr. et al. ........ 257/785
3,517,278 A * 6/1970 Hager .......................... 257/778

(Continued)

*Primary Examiner* — Teresa M Arroyo

(57) ABSTRACT

A semiconductor device includes a first insulator film having a first opening, a first wiring layer extending from the first opening onto the first insulator film, a first semiconductor chip mounted on the first insulator film so as to be electrically coupled with the first wiring layer, and a resin portion applied on the first insulation film to cover the first semiconductor chip.

9 Claims, 11 Drawing Sheets

(51) Int. Cl.

| | |
|---|---|
| *H01L 23/48* | (2006.01) |
| *H01L 23/52* | (2006.01) |
| *H01L 23/12* | (2006.01) |
| *H01L 23/053* | (2006.01) |
| *H01L 29/40* | (2006.01) |
| *H01L 23/538* | (2006.01) |
| *H01L 25/065* | (2006.01) |
| *H01L 25/10* | (2006.01) |
| *H05K 1/18* | (2006.01) |
| *H01L 25/03* | (2006.01) |
| *H05K 1/11* | (2006.01) |
| *H05K 3/20* | (2006.01) |
| *H01L 23/00* | (2006.01) |

(52) U.S. Cl.
CPC ............... *H05K2201/09509* (2013.01); *H05K 2201/09527* (2013.01); *H05K 2203/049* (2013.01)

(56) References Cited

U.S. PATENT DOCUMENTS

| | | | | |
|---|---|---|---|---|
| 3,973,271 | A * | 8/1976 | Okumura et al. | 257/587 |
| 4,488,166 | A * | 12/1984 | Lehrer | 257/755 |
| 4,676,868 | A * | 6/1987 | Riley et al. | 438/697 |
| 4,680,610 | A * | 7/1987 | Pammer | 257/737 |
| 4,843,034 | A * | 6/1989 | Herndon et al. | 438/622 |
| 5,532,516 | A * | 7/1996 | Pasch et al. | 257/752 |
| 5,731,624 | A * | 3/1998 | Motsiff et al. | 257/529 |
| 5,844,307 | A * | 12/1998 | Suzuki et al. | 257/690 |
| 6,069,407 | A * | 5/2000 | Hamzehdoost | 257/774 |
| 6,388,333 | B1 * | 5/2002 | Taniguchi et al. | 257/777 |
| 6,528,877 | B2 * | 3/2003 | Ernst et al. | 257/707 |
| 6,677,228 | B1 * | 1/2004 | Su et al. | 438/612 |
| 6,717,270 | B1 * | 4/2004 | Downey et al. | 257/758 |
| 6,778,406 | B2 * | 8/2004 | Eldridge et al. | 361/776 |
| 6,784,530 | B2 * | 8/2004 | Sugaya et al. | 257/686 |
| 6,836,007 | B2 * | 12/2004 | Michii et al. | 257/686 |
| 6,836,025 | B2 * | 12/2004 | Fujisawa et al. | 257/782 |
| 6,841,418 | B2 * | 1/2005 | Jeung et al. | 438/108 |
| 6,958,527 | B2 * | 10/2005 | Hanaoka | 257/668 |
| 7,056,820 | B2 * | 6/2006 | Cole et al. | 438/618 |
| 7,807,512 | B2 * | 10/2010 | Lee et al. | 438/127 |
| 7,888,785 | B2 * | 2/2011 | Ahn et al. | 257/686 |
| 8,022,508 | B2 * | 9/2011 | Miki | 257/620 |
| 8,084,858 | B2 * | 12/2011 | Daubenspeck et al. | 257/734 |
| 2002/0050642 | A1 * | 5/2002 | Oota et al. | 257/738 |
| 2003/0006494 | A1 * | 1/2003 | Lee et al. | 257/686 |
| 2003/0089968 | A1 * | 5/2003 | Shimizu | 257/668 |
| 2003/0197260 | A1 * | 10/2003 | Nishimura et al. | 257/686 |
| 2004/0145044 | A1 * | 7/2004 | Sugaya et al. | 257/698 |
| 2004/0160751 | A1 * | 8/2004 | Inagaki et al. | 361/763 |
| 2004/0178499 | A1 * | 9/2004 | Mistry et al. | 257/734 |
| 2004/0227225 | A1 * | 11/2004 | Fjelstad et al. | 257/690 |
| 2005/0001331 | A1 * | 1/2005 | Kojima et al. | 257/778 |
| 2005/0062170 | A1 * | 3/2005 | Biggs et al. | 257/780 |
| 2006/0065969 | A1 * | 3/2006 | Antol et al. | 257/700 |
| 2006/0138662 | A1 * | 6/2006 | Yamaha | 257/758 |
| 2006/0244119 | A1 * | 11/2006 | Ishimaru et al. | 257/686 |
| 2006/0278970 | A1 * | 12/2006 | Yano et al. | 257/700 |
| 2007/0007664 | A1 * | 1/2007 | Lee et al. | 257/779 |
| 2007/0023919 | A1 * | 2/2007 | Lin et al. | 257/774 |
| 2008/0128872 | A1 * | 6/2008 | Schepers | 257/664 |
| 2009/0283890 | A1 * | 11/2009 | Karnezos | 257/686 |
| 2011/0241040 | A1 * | 10/2011 | Yu et al. | 257/91 |
| 2011/0298096 | A1 * | 12/2011 | Miki | 257/620 |
| 2012/0080797 | A1 * | 4/2012 | Daubenspeck et al. | 257/762 |
| 2012/0168961 | A1 * | 7/2012 | Sakurai | 257/774 |
| 2013/0292817 | A1 * | 11/2013 | LaCroix et al. | 257/737 |
| 2014/0203428 | A1 * | 7/2014 | Colgan et al. | 257/737 |
| 2014/0239438 | A1 * | 8/2014 | Kilger et al. | 257/528 |

* cited by examiner

Related Art

SEMICONDUCTOR DEVICE HAVING A SEMICONDUCTOR CHIP MOUNTED ON AN INSULATOR FILM AND COUPLED WITH A WIRING LAYER, AND METHOD FOR MANUFACTURING THE SAME

RELATED APPLICATION

This Application claims priority to Japanese Patent Application 2007-034742 entitled "Semiconductor Device and Method for Manufacturing the Same" filed Feb. 15, 2007 which is incorporated herein in its entirety.

TECHNICAL FIELD

The invention relates to a semiconductor device and a method for manufacturing the same, and more particularly, to a semiconductor device having a semiconductor chip mounted on an insulator film, and a method for manufacturing the same.

BACKGROUND OF THE INVENTION

Recently the semiconductor device having the semiconductor chip mounted thereon has shown the tendency to have a thin structure. Patent documents such as Japanese Patent No. 3598060 and Japanese Unexamined Patent Application Publication No. 2005-101580 disclose a module with a built-in semiconductor device having a wiring on at least one surface of an insulator substrate as a related art example 1. Referring to FIG. 1 as a sectional view of the semiconductor device according to the related art example 1, a first semiconductor chip 16 is mounted onto a first wiring layer 14 using a die adhesive material 15. The first semiconductor chip 16 is electrically coupled with the first wiring layer 14 via a bonding wire 18. The first semiconductor chip 16 and the bonding wire 18 are sealed with a resin portion 35. The resin portion 35 is embedded in a resin portion 32 so as to be integrated therewith. The resin portion 32 is provided with the first wiring layer 14 and a second wiring layer 24 at opposite surfaces, respectively. A through electrode 34 pierces the resin portion 32 to connect the first and the second wiring layers 14 and 24.

In the related art example 1, as the resin portion 35 for sealing the first semiconductor chip 16 is embedded in the resin portion 32, it is difficult to reduce the thickness of the resin portion 32. As the first and the second wiring layers 14 and 24 are exposed, a short-circuit is likely to occur between those wiring layers. The insulator films may be applied to the surfaces of both the first and the second wiring layers 14 and 24 for suppressing the aforementioned short-circuit. However, this results in an increase in the thickness of the semiconductor device.

SUMMARY OF THE INVENTION

The present invention has been made in view of the above circumstances and provides a semiconductor device capable of reducing the thickness and a method for manufacturing the semiconductor device.

According to an aspect of the present invention, there is provided a semiconductor device which includes a first insulator film having a first opening, a first wiring layer extending from the first opening onto the first insulator film, a semiconductor chip mounted on the first insulator film and electrically coupled with the first wiring layer, and a resin portion applied onto the first insulator film to cover the semiconductor chip.

The present invention allows the thickness of the first wiring layer in the first opening to be reduced, allowing the semiconductor device to have the thin structure.

According to another aspect of the present invention, there is provided a semiconductor device formed by stacking the aforementioned semiconductor devices.

According to yet another aspect of the present invention, there is provided a method for manufacturing a semiconductor device that includes the steps of: forming a first wiring layer on a first insulator film having a first opening, the first wiring layer extending from the first opening; mounting a first semiconductor chip electrically coupled with the first wiring layer on the first insulator film; and forming a resin portion on the first insulator film to cover the first semiconductor chip. The invention allows the thickness of the first wiring layer in the first opening to be reduced, allowing the semiconductor device to have a thin structure.

DETAILED DESCRIPTION

First Embodiment

Figure 2A:
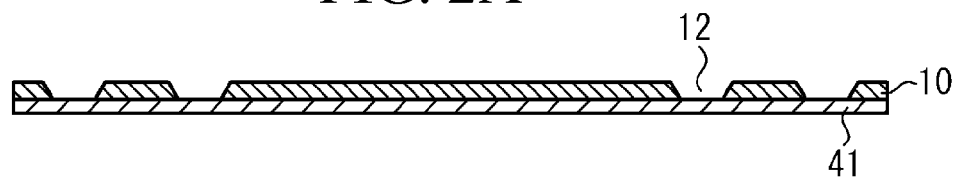
FIG. 2A, FIG. 2B and FIG. 2C show a method (first case) for manufacturing the semiconductor device according to a first embodiment.
Figure 2B:
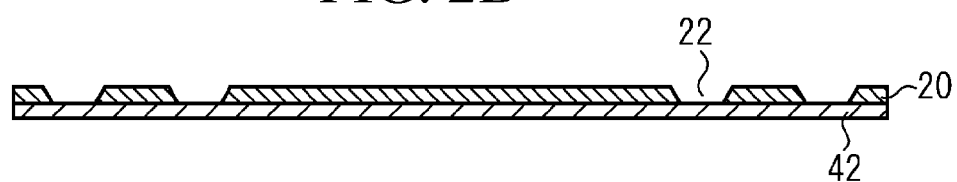

A first embodiment is an example of a semiconductor device usable as a wiring substrate. A method for manufacturing the semiconductor device according to the first embodiment will be described referring to FIGS. 2A to 5C. Referring to FIG. 2A, a resist formed of an epoxy resin is applied onto a dummy substrate 41 formed of a metal, an insulator, or the like to form a first insulator film 10. A first opening 12 is formed in the first insulator film 10 through a lithography technology. The first insulator film 10 with the first opening 12 is formed as described above. Referring to FIG. 2B, a second insulator film 20 having a second opening 22 is also formed on a dummy substrate 42.

Figure 2C:
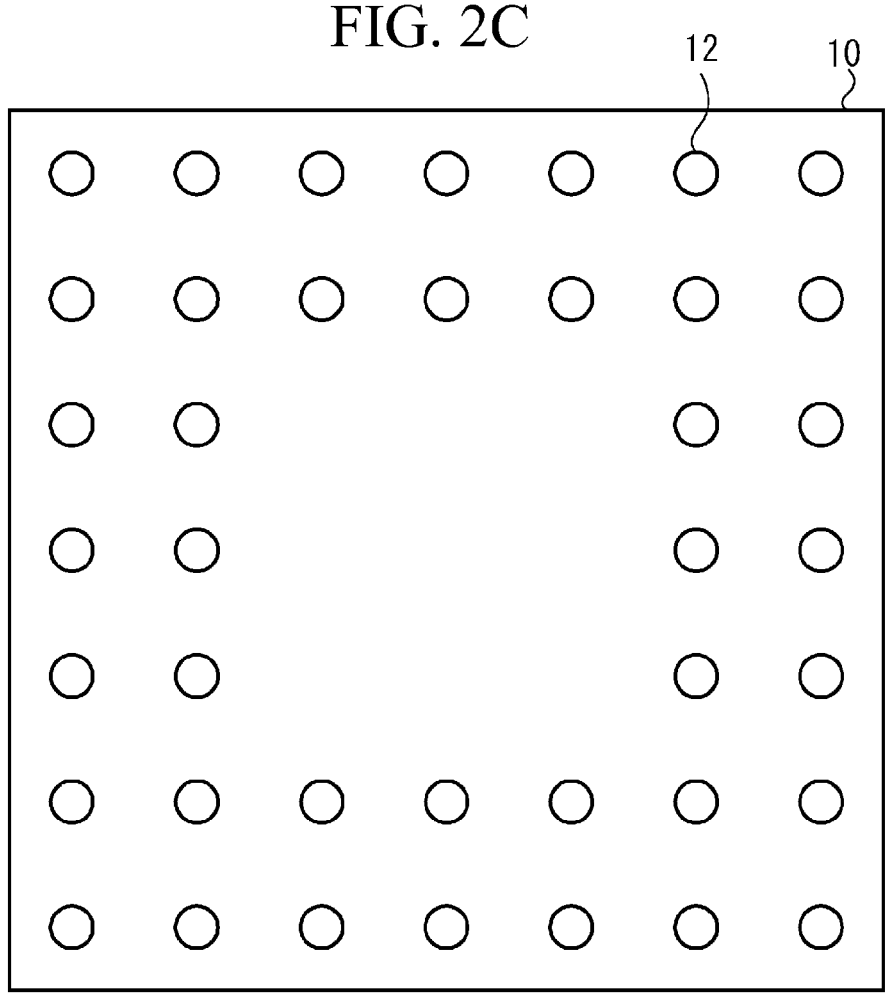

Referring to FIG. 2C, a plurality of the first openings 12 are formed in the first insulator film 10. The second insulator film 20 also has a plurality of the second openings 22. The first and the second insulator films 10 and 20 may be formed of a material other than epoxy resin, for example, polyimide resin, silicon resin and the like. Preferably, each of the first and the second insulator films 10 and 20 exhibits sufficient heat resistance against the temperature at which the resin portion 32 is formed as described later referring to FIG. 4.

Figure 3A:
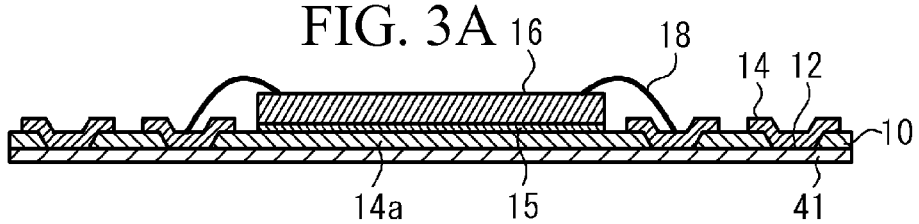
FIG. 3A, FIG. 3B and FIG. 3C show a method (second case) for manufacturing the semiconductor device according to a first embodiment.

Referring to FIG. 3A, a first wiring layer 14 formed of a conductive material such as copper (Cu) extending from the first opening 12 onto the first insulator film 10 is formed through plating. A first semiconductor chip 16 formed of a silicon material is mounted on a die attachment portion 14a of the first wiring layer 14 using a die adhesive material 15. In other words, the first semiconductor chip 16 is mounted on the first insulator film 10. The first semiconductor chip 16 and the first wiring layer 14 are electrically coupled via a conductive bonding wire 18.

Figure 3B:
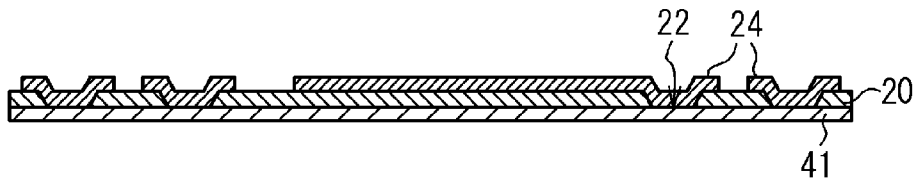
Figure 3C:
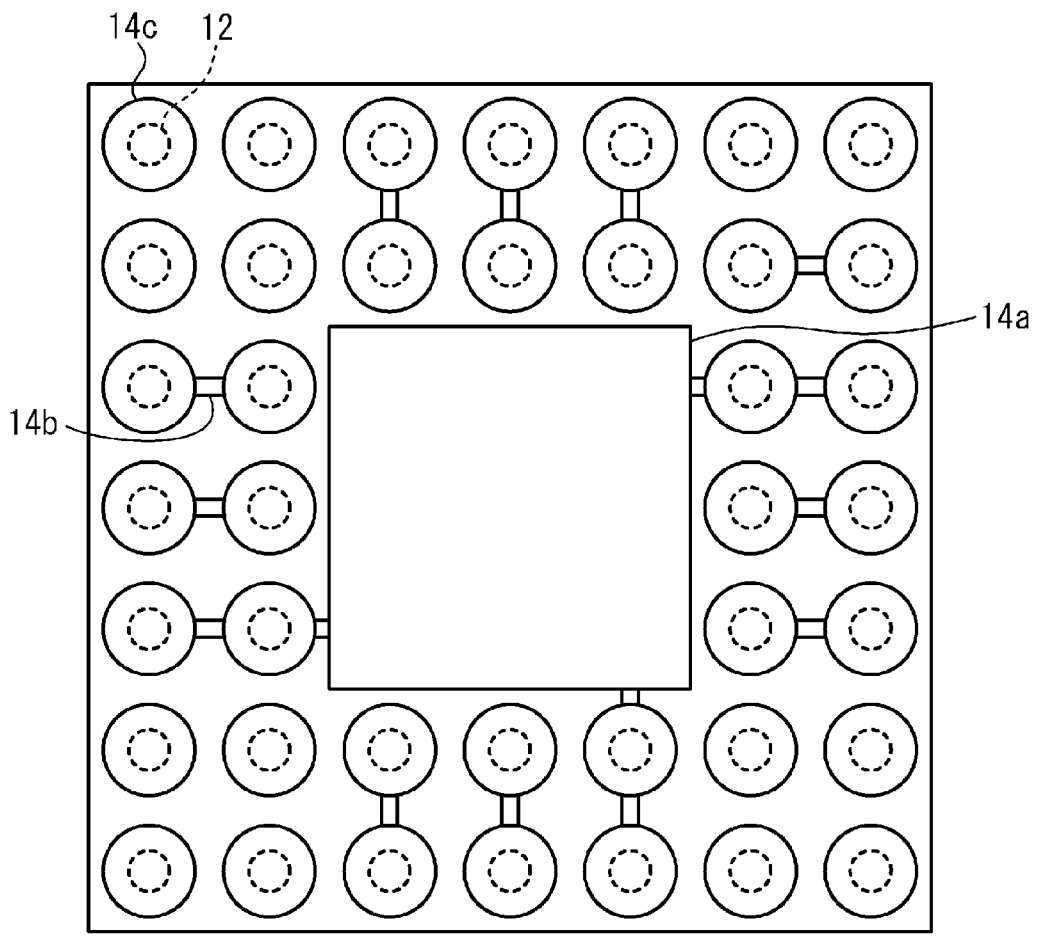

Referring to FIG. 3B, a second wiring layer 24 formed of a conductive material such as Cu extending from the second opening 22 onto the second insulator film 20 is formed using the method as shown in FIG. 3A. Referring to FIG. 3C, the first wiring layer 14 is formed on the first insulator film 10. The first wiring layer 14 includes the die attachment portion 14a on which the first semiconductor chip 16 is mounted, a pad portion 14c provided to cover the first opening 12, and a wiring portion 14b for connecting the pad portions 14c, or the pad portion 14c and the die attachment portion 14a.

Figure 4:
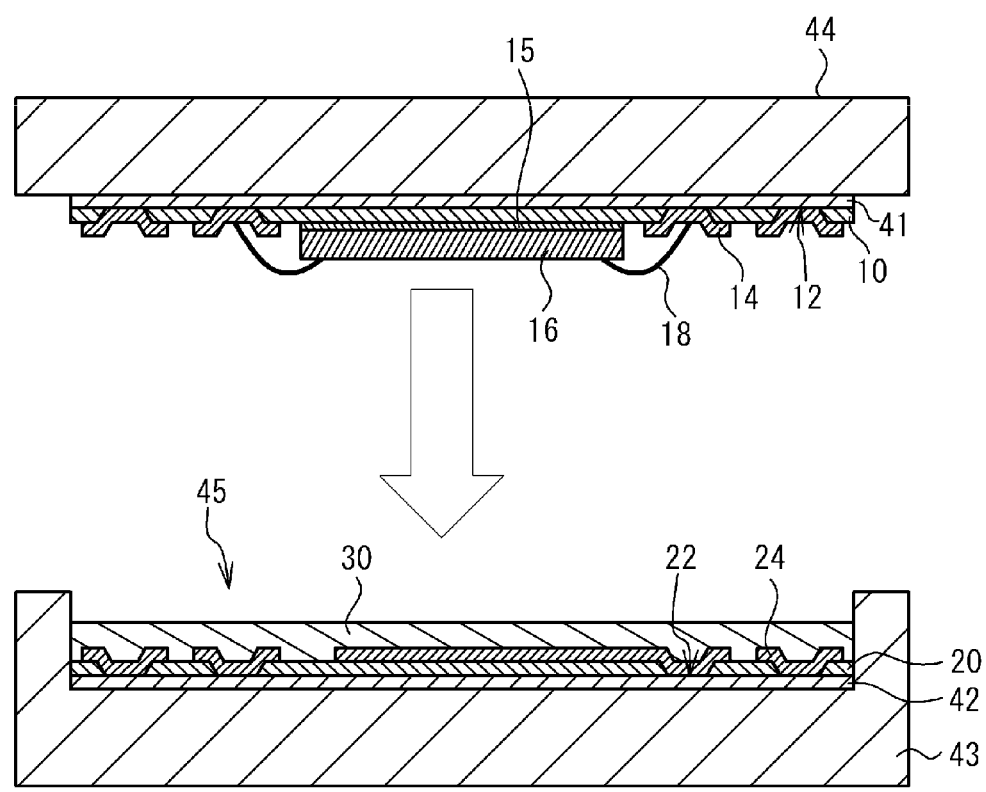
FIG. 4 is a view showing a method (third case) for manufacturing the semiconductor device according to the first embodiment.

Referring to FIG. 4, a dummy substrate 42 applied with the second insulator film 20 is disposed on the bottom surface of a lower mold 43 having a recess portion 45. A resin 30 derived from melting the epoxy thermoset resin is applied onto the second insulator film 20 and the second wiring layer 24. The first insulator film 10 on which the first semiconductor chip 16 is mounted and a dummy substrate 41 are disposed on an upper mold 44. The lower mold 43 and the upper mold 44 are joined such that the first semiconductor chip 16 is immersed in the resin 30 in the molten state. The pressure and the heat at about 175° C. are applied to the resin 30 in the molten state to be formed into a resin portion 32.

Figure 5A:
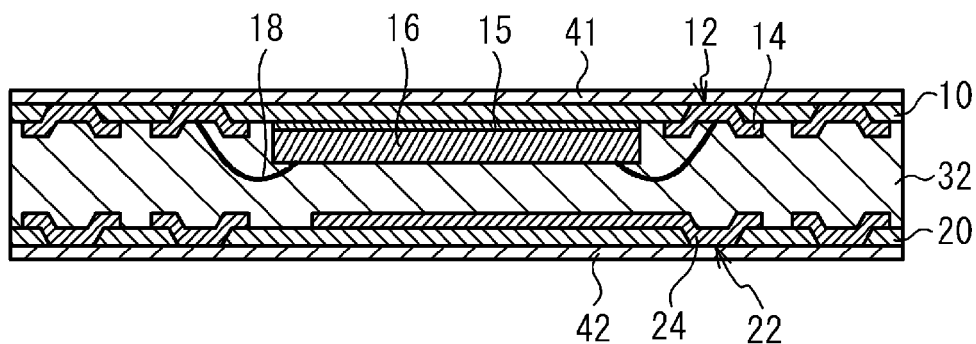
FIG. 5A, FIG. 5B and FIG. 5C show a method (fourth case) for manufacturing the semiconductor device according to the first embodiment.
Figure 5B:
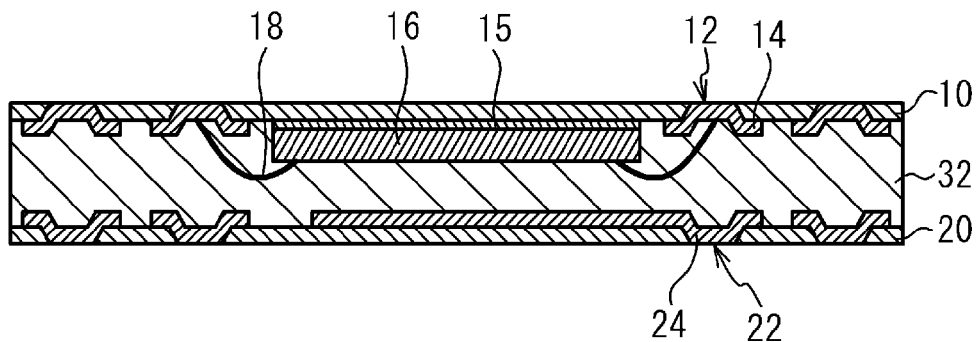
Figure 5C:
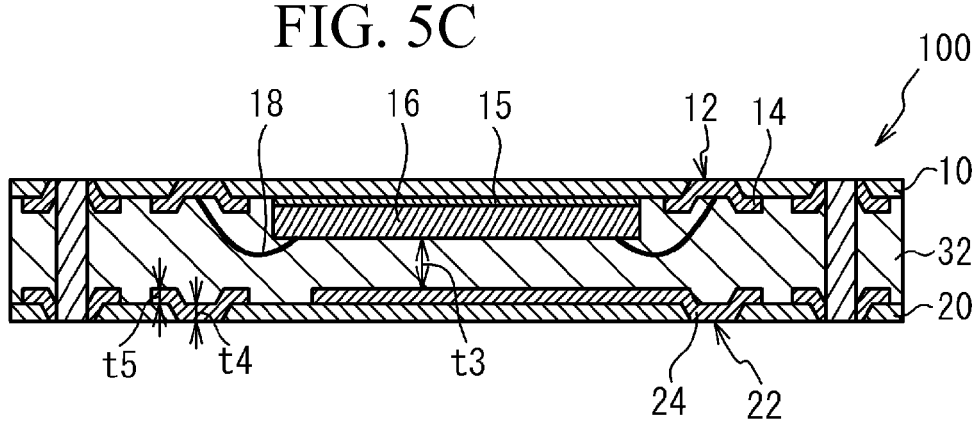

Referring to FIG. 5A, the first and the second wiring layers 14 and 24, and the first and the second insulator films 10 and 20 are formed on opposite surfaces of the resin portion 32 after removing the upper and the lower molds 44 and 43. That is, the resin portion 32 is formed on (below in FIG. 5A) the first insulator film 10 to cover the first semiconductor chip 16. Referring to FIG. 5B, the dummy substrates 41 and 42 are removed. Referring to FIG. 5C, a through hole that pierces the resin portion 32 from the first opening 12 to the second opening 22 is formed through the laser beam. A through electrode 34 formed of the conductive material such as Cu is formed in the through hole such that the first and the second wiring layers 14 and 24 are electrically coupled. In this way, a semiconductor device 100 according to the first embodiment is manufactured.

Figure 1:
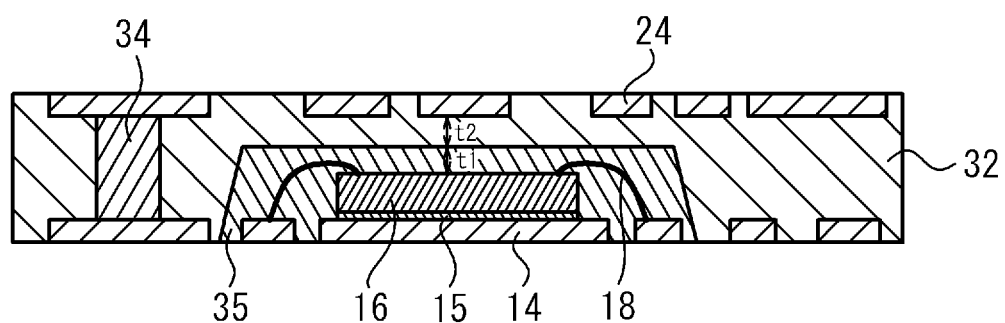
FIG. 1 is a sectional view of a semiconductor device as a related art example 1.

In the case where the first insulator film is applied to the lower surface of the first wiring layer 14 for the purpose of preventing a short-circuit therein in the related art example 1 as shown in FIG. 1, an electrode other than the first wiring layer 14 is formed in the opening of the first insulator film. Meanwhile, referring to FIG. 3A, the semiconductor device according to the first embodiment is provided with the first wiring layer 14 which extends from the first opening 12 in the first insulator film 10 onto the first insulator film 10. In the first embodiment, the short-circuit in the first wiring layer 14 can be prevented while reducing the thickness of the first wiring layer 14 in the first opening 12. This makes it possible to provide the semiconductor device with the thin structure.

Referring to FIG. 2A, the resist is applied onto the dummy substrate 41 to form the first insulator film 10 such that the thickness of the first insulator film 10 is reduced. As the first wiring layer 14 in the first opening 12 and the first wiring layer 14 on the first insulation film 10 can be formed simultaneously, the resultant thickness t4 of the first wiring layer 14 in the first opening 12 becomes substantially the same as the thickness t5 of the first wiring layer 14 on the first insulator film 10 as shown in FIG. 5C.

Referring to FIG. 5C, the second insulator film 20 with the second opening 22 is formed on (below in FIG. 5C) the resin portion 32. Referring to FIG. 3B, the second wiring layer 24 extends between the second insulator film 20 and the resin portion 32, from the second opening 22. As the first and the second wiring layers 14 and 24 are formed on opposite surfaces of the resin portion 32, the semiconductor device 100 according to the first embodiment may be used as the wiring substrate which contains the semiconductor chip, with the opposite surfaces formed as the wiring layers. As the second wiring layer 24 extends from the second opening 22 between the second insulator film 20 and the resin portion 32, the resultant device may be formed to have a thin structure.

As shown in FIG. 4, when the resin portion 32 is formed, the second insulator film 20 is applied onto the bottom of the lower mold 43 such that the second wiring layer 24 is placed on the second insulator film 20. The resin 30 in the molten state is applied to the second insulator film 20. The first insulator film 10 is disposed on the resin 30 in the molten state such that the first wiring layer 14 is disposed at the lower position and pressed to form the resin portion 32. The aforementioned method serves to directly seal the first semiconductor chip 16 with the resin portion 32. In the related art example 1 shown in FIG. 1, the semiconductor chip 16 is sealed with the resin portion 35. The thickness t1 defined by the resin portion 35 and the upper surface of the first semiconductor chip 16 is required to be in the range from 200 □m to 300 □m. The thickness t2 of the resin portion 32 on the resin portion 35 is required to be about 50 □m. Meanwhile, in the first embodiment, as the resin portion 35 is not formed as shown in FIG. 5C, the thickness t3 of the resin portion 32 on (below in FIG. 5C) the first semiconductor chip 16 may be set to about 100 □m. This makes it possible to form the semiconductor device 100 to have the thin structure.

Referring to FIG. 4, the second insulator film 20 applied to the dummy substrate 42 is disposed onto the bottom of the lower mold 43. The first insulator film 10 applied to another dummy substrate 41 is disposed onto the resin 30 in the molten state. It is preferable to form the resin portion 32 in the state where the first and the second insulator films 10 and 20 are reinforced. This makes it possible to reduce each thickness of the first and the second insulator films 10 and 20, resulting in the semiconductor device with the thin structure. Referring to FIG. 4, the first insulator film 10 may be disposed onto the bottom of the lower mold 43, and the second insulator film 20 may be disposed on the rein 30 in the molten state.

The bonding wire 18 is provided for connecting the first semiconductor chip 16 and the first wiring layer 14. In the case where the first semiconductor chip 16 and the first wiring layer 14 are connected via the bonding wire 18, in the semiconductor device as the related art example 1 shown in FIG. 1, the thickness t1 of the resin portion 35 is required to be increased such that the bonding wire 18 is not exposed from the resin portion 35. Meanwhile, the first embodiment allows the resin portion 32 to be formed between the bonding wire 18 and the first wiring layer 14. Accordingly, the thickness t3 shown in FIG. 5C may be reduced to about 100 □m. In the case where the first semiconductor chip 16 and the first wiring layer 14 are connected via the bonding wire 18, it is effective to form the resin portion 32 as shown in FIG. 5C.

Referring to FIG. 5C, the through electrode 34 is formed for connecting the first and the second wiring layers 14 and 24. The first and the second wiring layers 14 and 24 are thus electrically connected by the through electrode 34.

Second Embodiment

Figure 6:
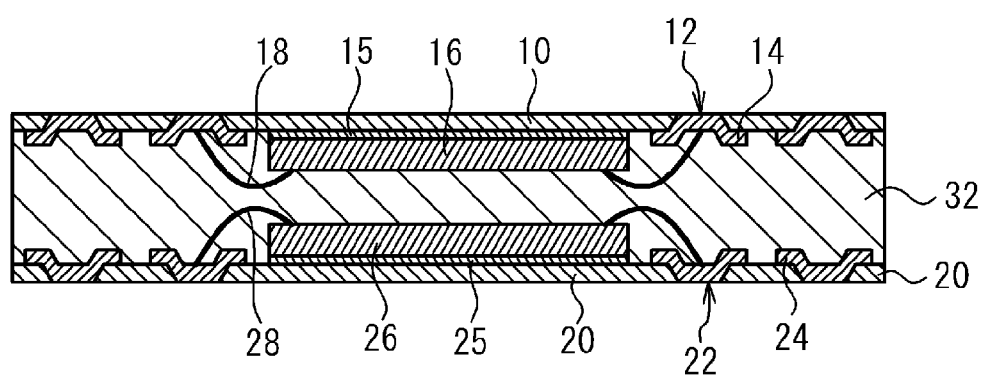
FIG. 6 is a sectional view of a semiconductor device according to a second embodiment.

FIG. 6 is a sectional view of a semiconductor device according to a second embodiment. In the semiconductor device according to the second embodiment, a second semiconductor chip 26 is mounted below (above in FIG. 6) the second insulator film 20 via a die adhesive material 25. The second semiconductor chip 26 is electrically coupled with the second wiring layer 24 via a bonding wire 28. The resin portion 32 covers the second semiconductor chip 26. Other structure is the same as that of the first embodiment, and explanation thereof, thus, will be omitted.

In the second embodiment, the semiconductor chips may be mounted on both the first and the second insulator films 10 and 20. A plurality of semiconductor chips may be mounted on at least one of the first and the second insulator films 10 and 20. The use of the plurality of semiconductor chips to be mounted allows improvement of the mount efficiency of the semiconductor chips.

Third Embodiment

Figure 7:
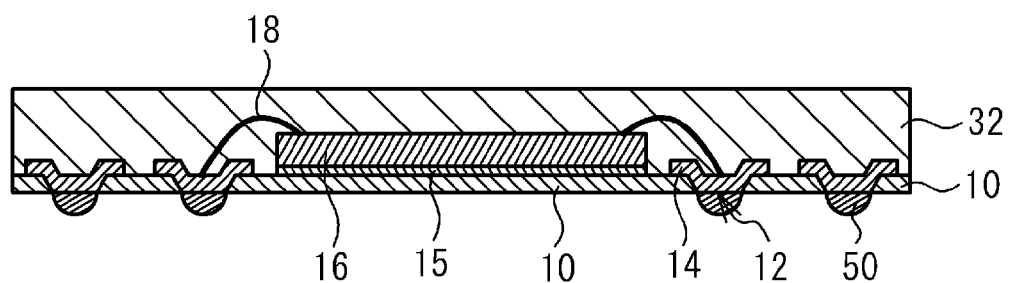
FIG. 7 is a sectional view of a semiconductor device according to a third embodiment.

In a third embodiment, the second insulator film is not applied. Referring to FIG. 7, the semiconductor device according to the third embodiment is not provided with the second insulator film 20 and the second wiring layer 24. Other structure is the same as that of the first embodiment, and the explanation thereof, thus, will be omitted. In the third embodiment, the insulator film and the wiring layer may be applied to at least one surface of the resin portion 32. The insulator film and the wiring layer are applied only to one surface of the resin portion 32 to realize the thin structure of the semiconductor device. However, the mount efficiency of the semiconductor chip may be deteriorated.

Fourth Embodiment

Figure 8:
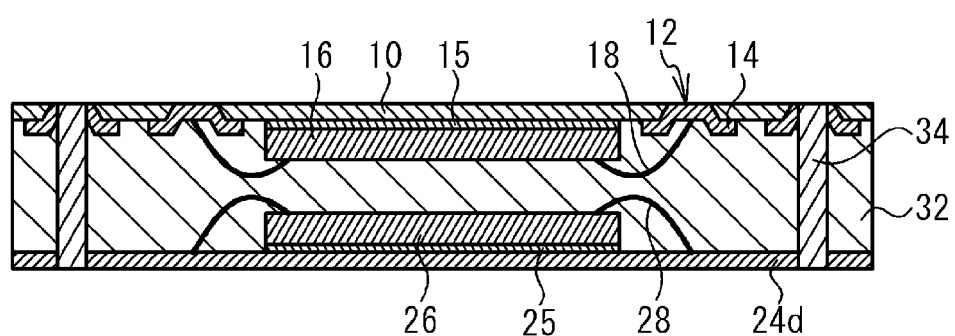
FIG. 8 is a sectional view of a semiconductor device according to a fourth embodiment.

In a fourth embodiment, a lead frame is used as the second wiring layer. Referring to FIG. 8, the second insulator film 20 is not used, and a lead frame 24d is used instead of the second wiring layer 24. Other structure is the same as that of the second embodiment, and the explanation thereof, thus, will be omitted. In the fourth embodiment, the insulator film may be applied only to one surface of the resin portion 32, and the wiring layers may be applied to opposite surfaces of the resin portion 32.

Fifth Embodiment

Figure 9:
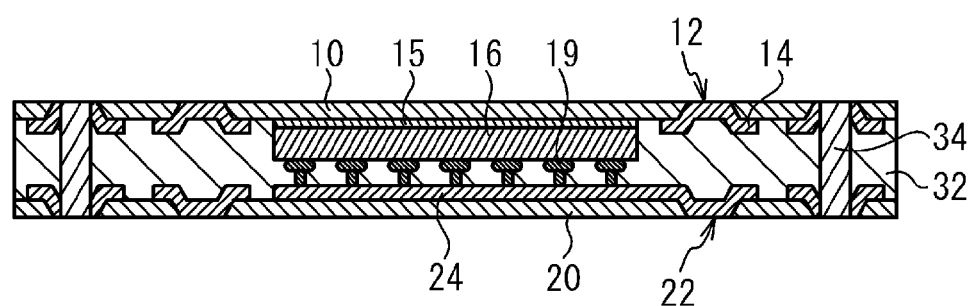
FIG. 9 is a sectional view of a semiconductor device according to a fifth embodiment.

In a fifth embodiment, the first semiconductor chip is flip-chip mounted. Referring to FIG. 9, the bonding wire 18 is not connected to the first semiconductor chip 16. A stud bump 19, for example, is formed on (below in FIG. 9) the surface of the first semiconductor chip 16. The stud bump 19 is electrically coupled with the second wiring layer 24. Other structure is the same as that of the first embodiment, and the explanation thereof, thus, will be omitted. In the fifth embodiment, the first semiconductor chip 16 and the first wiring layer 14 may be connected via the stud bump 19, the second wiring layer 24 and the through electrode 34. In the fifth embodiment, as the bonding wire 18 is not required, the structure of the semiconductor device may be formed to have the thinner structure compared with the first embodiment.

Sixth Embodiment

Figure 10:
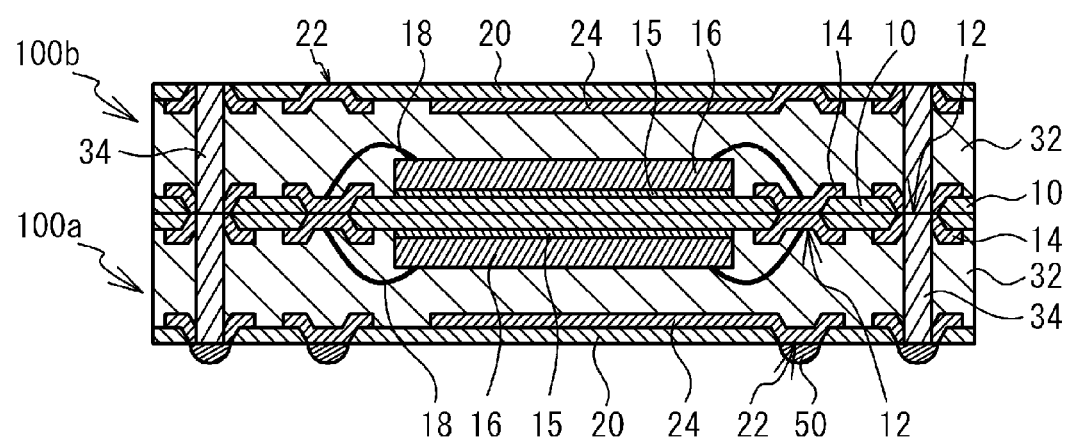
FIG. 10 is a sectional view of a semiconductor device according to a sixth embodiment.

A sixth embodiment is an example of a stacked semiconductor device formed by stacking the semiconductor devices according to the first embodiment. Referring to FIG. 10, semiconductor devices 100a and 100b according to the first embodiment are stacked. The second wiring layer 24 on the lower surface of the semiconductor device 100a is provided with solder balls 50. In the sixth embodiment, the semiconductor devices 100 according to the first embodiment may be stacked. The semiconductor devices to be stacked may be selected from those according to the second to the fifth embodiments besides the first embodiment.

Seventh Embodiment

Figure 11:
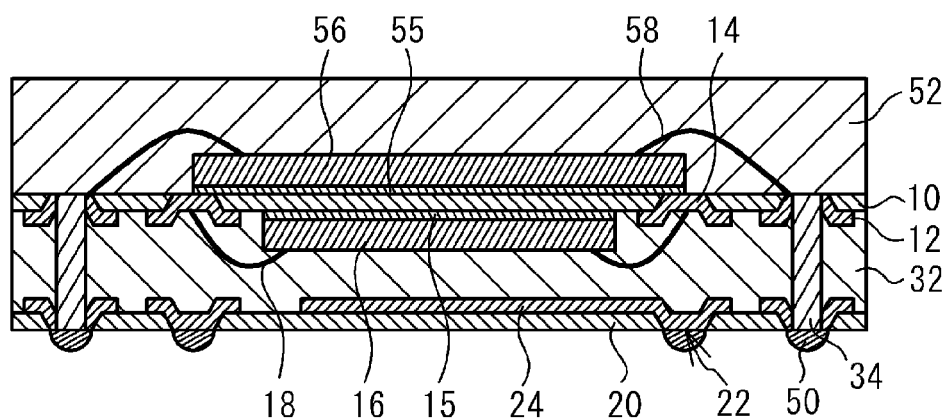
FIG. 11 is a sectional view of a semiconductor device according to a seventh embodiment.

A seventh embodiment is an example where another semiconductor chip is mounted on the semiconductor device 100 according to the first embodiment. Referring to FIG. 11, a semiconductor chip 56 is mounted on the semiconductor device 100 according to the first embodiment via a die adhesive material 55. The semiconductor chip 56 is electrically coupled with the first wiring layer 14 of the semiconductor device 100 via a bonding wire 58. The semiconductor chip 56 and the bonding wire 58 are sealed with a resin portion 52.

In the seventh embodiment, the semiconductor device according to any one of the first to the fifth embodiments may be used as the wiring substrate such that the semiconductor chip 56 is mounted thereon. In the seventh embodiment, the semiconductor chip 56 is face-up mounted. However, it may be facedown mounted, for example, the flip-chip mounting.

As have been described with respect to the preferred embodiments of the invention, it is to be understood that the invention is not limited to the aforementioned embodiments, but may be changed or modified without departing from the scope of the appended claims.

Finally, various aspects of the present invention are summarized below.

According to an aspect of the present invention, there is provided a semiconductor device which includes a first insulator film having a first opening, a first wiring layer extending from the first opening onto the first insulator film, a semiconductor chip mounted on the first insulator film and electrically coupled with the first wiring layer, and a resin portion applied onto the first insulator film to cover the semiconductor chip. The present invention allows the thickness of the first wiring layer in the first opening to be reduced, allowing the semiconductor device to have the thin structure.

The aforementioned structure may be provided with a bonding wire for connecting the first semiconductor chip and the first wiring layer. The resultant semiconductor device is allowed to have the thin structure in spite of connecting the first semiconductor chip and the first wiring layer that are difficult to be thin via the bonding wire.

The structure may be provided with a second insulator film having a second opening applied onto the resin portion, and a second wiring layer that extends between the second insulator film and the resin portion, from the second opening. The resultant structure allows formation of the wiring layers at opposite surfaces, resulting in the semiconductor device with the thin structure.

The structure is provided with a second semiconductor chip disposed below the second insulator film so as to be electrically coupled with the second wiring layer. The resin portion may be structured to cover the second semiconductor chip. As two or more semiconductor chips are provided, the mount efficiency of the semiconductor chips may be improved.

The structure may be provided with a through electrode for connecting the first and the second wiring layers. The structure allows the through electrode to electrically couple the first and the second wiring layers.

In the structure, a thickness of the first wiring layer in the first opening may be equal to a thickness of the first wiring layer on the first insulator film.

According to another aspect of the present invention, there is provided a semiconductor device formed by stacking the aforementioned semiconductor devices.

According to yet another aspect of the present invention, there is provided a method for manufacturing a semiconductor device that includes the steps of: forming a first wiring layer on a first insulator film having a first opening, the first wiring layer extending from the first opening; mounting a first semiconductor chip electrically coupled with the first wiring layer on the first insulator film; and forming a resin portion on the first insulator film to cover the first semiconductor chip. The invention allows the thickness of the first wiring layer in the first opening to be reduced, allowing the semiconductor device to have a thin structure.

In the structure, a resist may be applied on a dummy substrate to form the first insulator film. The structure reduces the thickness of the first insulator film, allowing the semiconductor device to have a thin structure.

In the structure, a second wiring layer may be formed on a second insulator film having a second opening, the second wiring layer extending from the second opening, and the second insulator film may be provided on the resin portion such that the second wiring layer is interposed between the second insulator film and the resin portion. The structure allows manufacturing of the semiconductor device having the wiring layers on opposite surfaces of the resin portion.

In the structure, the step of forming the resin portion may include the steps of: providing one of the first and the second insulator films on a bottom of a mold such that corresponding one of the first and the second wiring layers is disposed on an upper side; applying a resin in a molten state onto one of the first and the second insulator films; and forming the resin portion by applying pressure to the other of the first and the second insulator films on the resin in the molten state such that corresponding one of the first and the second wiring layers is disposed on a lower side. The structure allows the first semiconductor chip to be directly sealed with the resin portion, allowing the semiconductor device to have a thin structure.

In the structure, the step of providing one of the first and the second insulator films on the bottom of the mold may be performed by providing on the bottom of the mold one of the first and the second insulator films applied to the dummy substrate. The step of forming the resin portion may include the step of providing on the resin in the molten state the other of the first and the second insulator films applied to another dummy substrate. The structure allows the first and the second insulator films to be reinforced with the dummy substrate. This makes it possible to reduce each thickness of the first and the second insulator films, allowing the semiconductor device to have a thin structure.

The present invention is not limited to the specifically disclosed embodiments and variations, and other embodiments and variations may be made without departing from the scope of the present invention.

I claim:

1. A semiconductor device comprising:
a first insulator film having a first opening and a first surface;
a first wiring layer comprising first portions that extend from the first opening onto the first surface of the first insulator film in first and second directions and a second portion, situated between the first portions, that comprises a first surface that is coplanar with the first surface of the first insulator film onto which the first portions extend and a second surface that is coplanar with a second surface of the first insulator film wherein the first surface of the first insulator film and the second surface of the first insulator film are single leveled;
a first semiconductor chip mounted on the first insulator film and electrically coupled with the first wiring layer;
a resin portion applied onto the first insulator film and adjacent to the sides of the semiconductor chip and adjacent to the surface of the semiconductor chip that faces away from the first insulator film and the first wiring layer;
a second insulator film having a second opening applied onto the resin portion; and
a second wiring layer extending between the second insulator film and the resin portion, wherein the resin portion fills the volume between the semiconductor chip and the second insulator film, between the semiconductor chip and the second wiring layer, between the first insulator film and the second insulator film, and between the first wiring layer and the second wiring layer.

2. The semiconductor device of claim 1, further comprising a bonding wire for connecting the first semiconductor chip and the first wiring layer.

3. The semiconductor device according to claim 1, further comprising a second semiconductor chip disposed below the second insulator film so as to be electrically coupled with the second wiring layer, wherein the resin portion covers the second semiconductor chip.

4. The semiconductor device according to claim 1, further comprising a through electrode for connecting the first and the second wiring layers.

5. The semiconductor device according to claim 1, wherein a thickness of the first wiring layer in the first opening is equal to a thickness of the first wiring layer on the first insulating film.

6. The semiconductor device according to claim 3, wherein said first semiconductor chip and said second semiconductor chip are stacked.

7. The semiconductor devices according to claim 3, wherein said first semiconductor chip and said second semiconductor chip are mounted to have facing top surfaces.

8. The semiconductor device according to claim 1, further comprising a second semiconductor chip that is mounted on a leadframe.

9. The semiconductor device according to claim 1 wherein said first semiconductor chip is flip-chip mounted.

* * * * *